(12) United States Patent
Zundel et al.

(10) Patent No.: US 6,882,004 B2
(45) Date of Patent: Apr. 19, 2005

(54) SEMICONDUCTOR COMPONENT, TRENCH STRUCTURE TRANSISTOR, TRENCH MOSFET, IGBT, AND FIELD-PLATE TRANSISTOR

(75) Inventors: Markus Zundel, Taufkirchen (DE); Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 7 days.

(21) Appl. No.: 10/282,971

(22) Filed: Oct. 29, 2002

(65) Prior Publication Data

US 2003/0080378 A1 May 1, 2003

(30) Foreign Application Priority Data

Oct. 29, 2001 (DE) .......................................... 101 53 315

(51) Int. Cl.[7] .......................... H01L 29/76; H01L 29/94; H01L 31/062; H01L 31/113; H01L 31/119
(52) U.S. Cl. ........................ 257/327; 257/329; 257/330; 257/331; 257/332; 257/333; 257/334
(58) Field of Search ................................. 257/327–334

(56) References Cited

U.S. PATENT DOCUMENTS

| | | | | |
|---|---|---|---|---|
| 5,012,308 A | * | 4/1991 | Hieda .......................... | 257/301 |
| 5,512,767 A | * | 4/1996 | Noble, Jr. .................... | 257/301 |
| 5,742,076 A | * | 4/1998 | Sridevan et al. ............... | 257/77 |
| 5,883,411 A | * | 3/1999 | Ueda et al. ................... | 257/331 |
| 5,998,833 A | * | 12/1999 | Baliga ......................... | 257/329 |
| 6,351,018 B1 | * | 2/2002 | Sapp ........................... | 257/499 |
| 6,380,569 B1 | * | 4/2002 | Chang et al. ................ | 257/256 |
| 6,521,954 B1 | * | 2/2003 | Kouzuki et al. ............. | 257/374 |

* cited by examiner

Primary Examiner—Tom Thomas
Assistant Examiner—Jesse A. Fenty
(74) Attorney, Agent, or Firm—Laurence A. Greenberg; Werner H. Stemer; Ralph E. Locher

(57) ABSTRACT

A semiconductor component has a minimal size and area requirement. The semiconductor component is formed in a trench with wall regions and a bottom region. Terminal regions for the electrical connection of first and second contact regions (S, B) are formed at least partly within the trench (30).

63 Claims, 17 Drawing Sheets

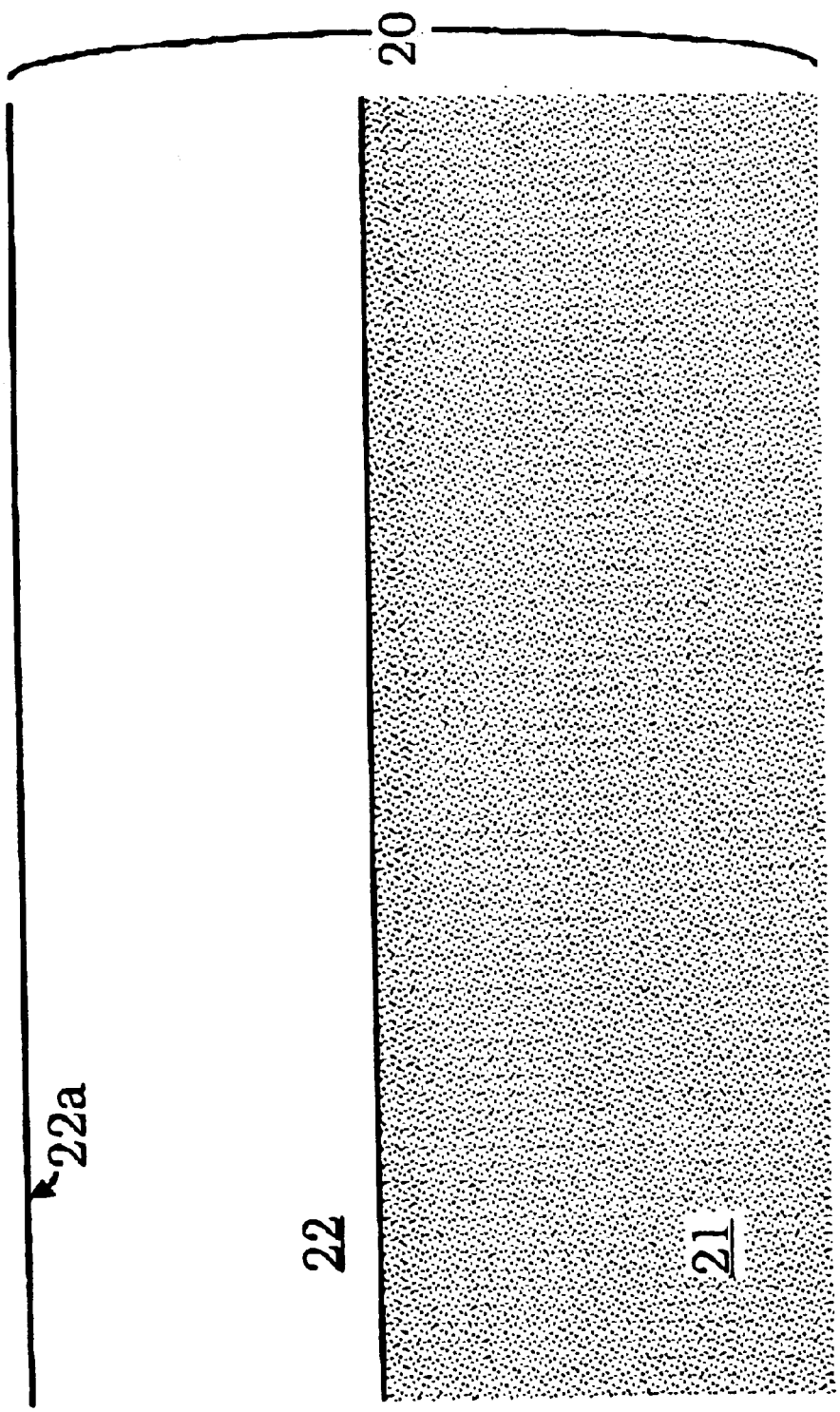

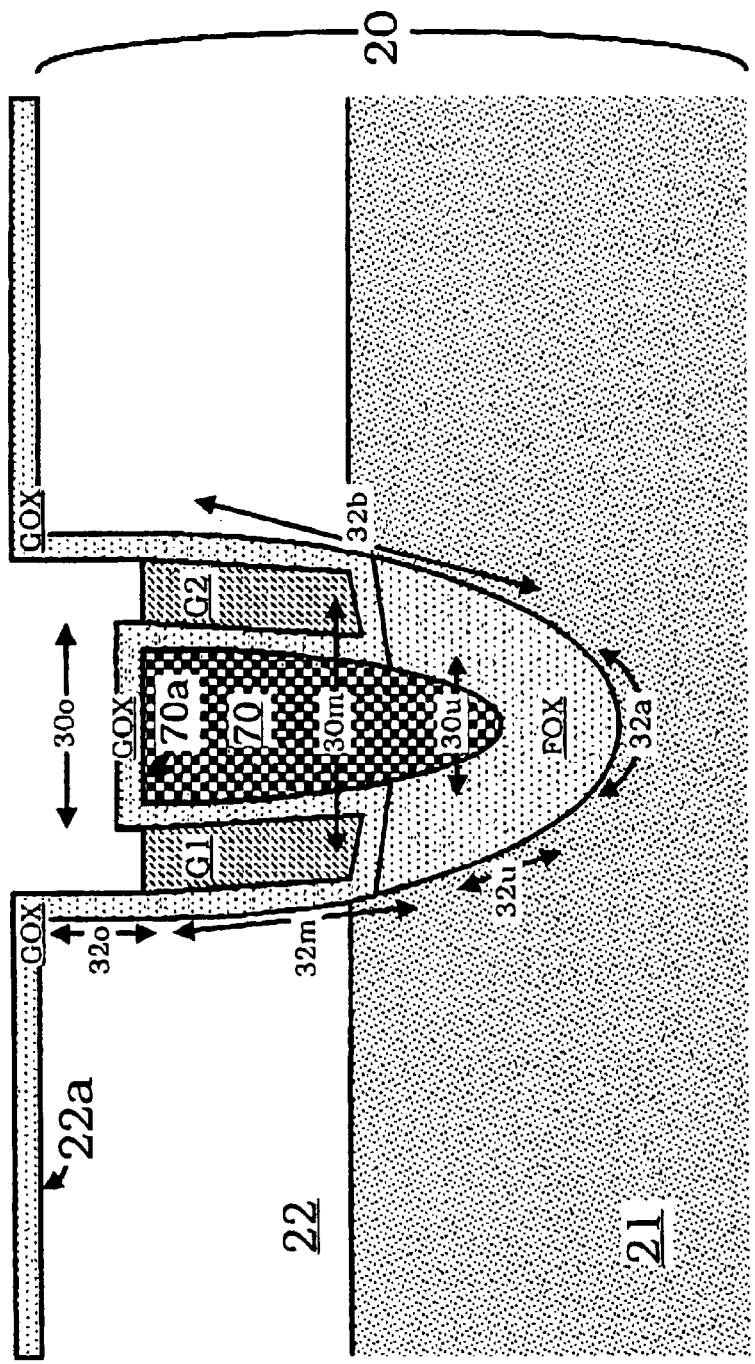

SEMICONDUCTOR COMPONENT, TRENCH STRUCTURE TRANSISTOR, TRENCH MOSFET, IGBT, AND FIELD-PLATE TRANSISTOR

BACKGROUND OF THE INVENTION

Field of the Invention

The invention relates to a semiconductor component, in particular, a trench structure transistor device, trench MOSFET, or the like. Typically, such semiconductor components have a trench with wall regions and a bottom region formed in a semiconductor substrate region. In addition, they have at least one first contact region formed outside the trench in direct proximity to the trench in the region of an upper trench section.

In modern semiconductor circuit configurations, a multiplicity of semiconductor components are often used in a very confined space. One endeavor in the development of new semiconductor circuit conceptions and corresponding fabrication methods is, inter alia, to achieve a maximum area density or volume density of semiconductor components in a semiconductor circuit configuration of this type.

Semiconductor components are often formed in the region of so-called trench structures, that is to say as so-called trench semiconductor components. In this case, the trench itself, but also its surroundings, serve for realizing specific functionalities through the configuration of specific conductivity regions. In this case, the respective conductivity regions form, if appropriate, specific contact regions. Owing to the need to configure a maximum number of semiconductor components adjacently in a very confined space, there is the risk of crosstalk between adjacent semiconductor components and their respective contact regions taking place as a result of the confined spatial proximity, which can adversely affect the operational reliability both of the individual semiconductor component and of the entire semiconductor circuit configuration.

Therefore, in conventional semiconductor circuit configurations, specific minimum distances are realized between adjacent semiconductor components, compliance with the minimum distances making cross talk or an interaction between adjacent semiconductor components of the semiconductor circuit configuration as improbable as possible. Complying with minimum distances is disadvantageous, however, to the effect that this inherently results in limits with regard to an integration density to be increased and further increasing the compactness of semiconductor circuit configurations.

SUMMARY OF THE INVENTION

It is accordingly an object of the invention to provide a semiconductor component, a trench structure transistor, a trench MOSFET, an IGBT, and a field-plate transistor that overcome the hereinafore-mentioned disadvantages of the heretofore-known devices of this general type and that ensures the full functionality of the individual component and integrates in a semiconductor circuit configuration having a high density.

With the foregoing and other objects in view, there is provided, in accordance with the invention, a semiconductor component. The semiconductor component includes a semiconductor substrate region having a trench with a width, and wall regions and a bottom region formed therein. The wall regions include an upper trench section. A contact region is formed outside and directly proximate the trench in a region of the upper trench section. A terminal region is for electrical connection of the contact region and formed at least partly within the trench. A trench side region is narrower than the width of the trench.

In the case of the semiconductor component of the generic type, a trench with wall regions and with a bottom region is formed in a semiconductor substrate region. At least one first contact region is formed outside the trench in direct proximity to the trench in the region of an upper trench section.

In the case of the semiconductor component according to the invention, which may be interpreted in particular as a trench structure transistor device, trench MOSFET, or the like, it is provided that a terminal region for the electrical connection of the first contact region is formed at least partly within the trench, and that, as a result, the size and, in particular, the area requirement and/or the—in particular lateral—pitch of the semiconductor component are reduced.

Consequently, it is a fundamental idea of the present invention to transfer a terminal region for the electrical connection of a contact region provided outside the trench at least partly to within the trench. In conventional semiconductor components, the terminal regions that are necessarily present for contact regions are formed outside the trench, in particular in an intermediate region of adjacent trenches of mutually adjacent individual semiconductor components. This intermediate region between two adjacent trenches, which is also referred to as a mesa, cannot be reduced any further below a specific minimum amount when conventional semiconductor components in semiconductor circuit configurations are used.

An alternative or addition to forming the respective terminal region or a part thereof within the trench is to form the terminal region or a part thereof in a region above the trench. This configuration reduces the lateral size without risking lateral crosstalk.

Many semiconductor components generally do not have only a first contact region. In accordance with a preferred embodiment of the semiconductor component according to the invention, it is therefore provided that a second contact region is formed outside the trench in direct proximity to the trench in the region of a central trench section.

In this case, it is then further preferred that a terminal region for the electrical connection of the second contact region is formed at least partly within the trench. Here, too, in contrast to known semiconductor components, a further space saving results since, in conventional procedures, the terminal regions are likewise formed in the region of the mesa between two adjacent semiconductor components.

It is further preferred that the terminal regions for the first and second contact regions are formed at least partly as a common terminal region, in particular within the trench. This measure is expedient particularly when the first contact region and the second contact region are intended or are able to be held at an essentially identical electrical potential.

The compactness of the semiconductor component according to the invention is further increased it the first contact region and/or the second contact region are formed in each case in contact with the respective wall regions of the respective trench sections.

In another embodiment of the semiconductor according to the invention, the terminal regions for the first and second contact regions and, in particular, the common terminal region thereof are formed at least in the region of the upper trench section. What is achieved by this measure is that critical regions in the central and lower trench sections can be used for further realization of the function of the semiconductor component.

In another embodiment of the semiconductor component according to the invention, a contact of the first contact region with the first terminal region or with the common terminal region is realized in a part of an upper wall section of the wall region of the trench.

In particular, the contact is formed as a direct mechanical and electrical contact or as a contact via a diffusion region or implantation region.

Furthermore, the first contact region forms at least a part of an upper wall section of the wall region of the trench, that is, without an additional wall layer or the like.

In another advantageous embodiment of the semiconductor component according to the invention, the second contact region is formed directly proximate the first contact region, in particular in direct contact with the latter.

A particularly suitable structure results again if the second contact region forms at least a part of a central wall section of the wall region of the trench, that is to say without additional provision of a wall layer.

One possible form of the realization of a contact of the second contact region with the second terminal region or with the common terminal region is formed for example via a diffusion region or implantation region.

This implantation region or diffusion region for the contact-connection of the second contact region is formed for example as a localized surface strip essentially running transversely with respect to the trench or the extending direction thereof. The strip is made narrow, for example in particular in comparison with the trench width.

The implantation region or diffusion region for the contact-connection of the second contact region may also be formed as a surface region that essentially runs longitudinally with respect to the trench or the extending direction thereof and, in particular, also spatially overlaps the first contact region.

In order to realize the functionality of the semiconductor component, for example, a third contact region is formed within the trench.

In this case, if appropriate, the third contact region is formed at least partly in the region of the central trench section.

If appropriate, in this case, at least one insulation region is provided which electrically insulates the third contact region from the first and second contact regions and from the first and second or common terminal region.

In order to further realize the functionality of the semiconductor component, as an alternative or in addition, a fourth contact region may be formed outside the trench in direct proximity to the trench in the region of a lower trench section.

The semiconductor component according the invention is particularly advantageously configured as a trench structure transistor device, in particular as a trench MOSFET or, the like, or as an IGBT.

In order to realize the respective functionality of the semiconductor component according to the invention, it is provided that the first contact region is formed as a source region, the second contact region is formed as a body region or a substrate region, the third contact region is formed as a gate region, the fourth contact region is formed as a drain region and/or the first/second common terminal region is formed as a source-body terminal region.

If appropriate, the semiconductor component according to the invention is formed as a so-called field plate transistor or the like.

In this case, in the region of the lower trench section and/or in a transition region between the lower trench section and the central trench section of the trench between of the trench the semiconductor substrate region and the third contact region or gate contact region and/or the terminal region for the first/third contact region or the source/body contact region, a reinforced insulation region is formed. In particular, the reinforced insulation region can be at least one field plate or the like and/or in particular a gate oxide that is provided and/or a field oxide that is provided essentially being formed within the trench.

In accordance with a particularly preferred embodiment of the semiconductor component according to the invention, the third contact region or the gate contact region is essentially formed within the trench, in particular in the form of a polysilicon region or the like. In addition or as an alternative, it is advantageously provided that the—in particular common—terminal region for the first and/or third contact region, or the source and body contact region, is essentially formed within the trench, in particular in the form of a polysilicon region or the like.

In another preferred embodiment of the semiconductor component according to the invention, the first and/or the third contact region, in particular the source and/or body contact region, in particular between adjacent semiconductor components, are formed as conductivity regions essentially in the form of an inverted U, if appropriate with an interruption in the region of the U arc, in particular in the region of the so-called mesa, that is to say in the region between two directly adjacent semiconductor components.

Furthermore, the third contact region or gate contact region can be formed within the trench in a manner isolated from terminal metallizations or the like by at least one insulation layer, in particular by an isolation oxide and by the—in particular common—terminal region for the first and/or third contact region, in particular the source and/or body contact region, in particular in the form of a polysilicon region.

It is particularly advantageous that, essentially within the trench of the semiconductor component according to the invention, at least three contact regions, terminal regions, electrode regions, and/or the like are provided, in particular in the form of polysilicon regions.

In this case, it is preferred that the at least three contact regions, terminal regions, electrode regions, and/or the like have terminal regions for the first and/or third contact region, in particular the source and/or body contact region, and/or third contact regions, in particular gate contact regions or the like.

These and further aspects of the present invention are also illustrated further on the basis of the explanations below.

Inter alia, reducing the on resistivity $R_{on} \cdot A$ has an ever more prominent part to play in the development of new generations of trench transistors and, in particular, of DMOS power transistors.

To that end, it is conventional practice to optimize the geometrical dimensions of the transistor in such a way as to minimize the area requirement on the wafer per channel width. An essential step in this case is implementing the transition from planar concepts with a large area requirement to vertical trench concepts with a significantly reduced area requirement. In this case, an alternate configuration of active cell trench, silicon mesa with contact hole and active cell trench is chosen, the ratio of trench width/silicon mesa always being, less than 1. The contact hole can also be replaced by a so-called poly plug. The gate/source electrodes in the active cell trench can also be interleaved in one another.

The invention proposes that the source and body terminal, which was positioned beside the active cell trenches on the silicon mesa in the previous trench transistors, is now integrated in the active cell trenches. The major advantage in this case is that the safety distances from the contact hole of the source-body terminal and the contact hole itself are obviated and consequently, the extent of the silicon mesa can be significantly reduced.

Structural features in this case are that the gate poly is isolated from the source metallization by oxide and by a polysilicon at source potential and that a ratio of trench width/silicon-mesa of significantly less than 1 results. Prior art e.g.: 800 nm trench width+500 nm safety distance plus 600 nm contact hole width+500 nm safety distance. Invention: 800 nm trench width+approximately 400 nm silicon mesa.

The dense succession of trenches thus achieved has the result that the avalanche breakdown can now no longer take place in the cell center, but rather is bound to the trench bottom. To that end, it is optionally possible to introduce a defined oxide thinning in the trench bottom that is adapted to the respective voltage class of the component.

One possible attractive form of the source-body terminal that can be integrated well is the embodiment as a poly plug. The source poly may optionally also be applied over the whole area. The source metallization can be applied to the source poly both over the whole area and in a defined manner.

One inventive idea resides in uniting the active cell trench with the source-body terminals in a single trench which fulfils both functions. The silicon mesa lying between the trenches can thus be significantly reduced. A significant shrink (by approximately 50% in the cell pitch) and an improvement in the $R_{on} \cdot A$ are achieved.

A further idea according to the invention is that all of the trench transistors in which in each case at least two mutually independent electrodes are accommodated in the individual trenches have trenches with a trench width greater than the width of the intervening silicon mesa.

In one embodiment, only the source region is connected to the source poly via the trench sidewall; the body region is connected to a metal contact via the body contact strips on the surface.

On the other hand, the source regions may be fabricated by implanting a trench sidewall, and the body region by implanting a whole-area implantation. This results in a source contact via the trench sidewall and an elongated body contact on the silicon mesa (center of the mesa).

A metallic layer and/or a silicide may be present between the source poly and the silicon mesa.

The entire source poly may lie on a metal layer and/or a silicide.

The source poly may lie on a metal layer and/or a silicide.

The source poly may be embodied as metal.

One possible fabrication method includes, if appropriate, the following steps:

1. Etching trenches, depositing field oxide or applying it by oxidation.
2. Inserting plug made of e.g. silicon nitride, higher than the later gate oxide.
3. Etching back field oxide.
4. Depositing gate oxide or applying it by oxidation. Plug material must be resistant in this case.
5. Depositing gate poly.
6. Poly recess etching to the level of the plug; in the process, at the chip edge, masking for planar gate poly taken out from the trenches.
7. Removing oxide; oxide thickness to be etched away corresponds to the gate oxide thickness.
8. Etching out plug, selectively with respect to silicon and with respect to silicon oxide.
9. Depositing isolation oxide or applying it by oxidation.
10. Removing oxide at trench sidewall and silicon surface; source poly acts as plug in this case.
11. Removing oxide at trench sidewall and silicon surface; source poly acts as plug in this case.
12. Second step of source poly deposition and/or siliciding step with subsequent source poly deposition.
13. Optionally etching back source poly, in the process optionally a siliciding step.
14. BPSG deposition, then patterning BPSG in a large-area manner and etching it back to silicon surface or poly surface (contact hole process).
15. Applying metallization, source/body metallization.

Other features that are considered as characteristic for the invention are set forth in the appended claims.

Although the invention is illustrated and described herein as embodied in a semiconductor component, a trench structure transistor, a trench MOSFET, an IGBT, and a field-plate transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4A–4M are sectional views showing different intermediate stages during fabrication of an embodiment of a semiconductor component according to the invention.

DESCRIPTION OF THE PREFERRED EMBODIMENTS

Figure 1:
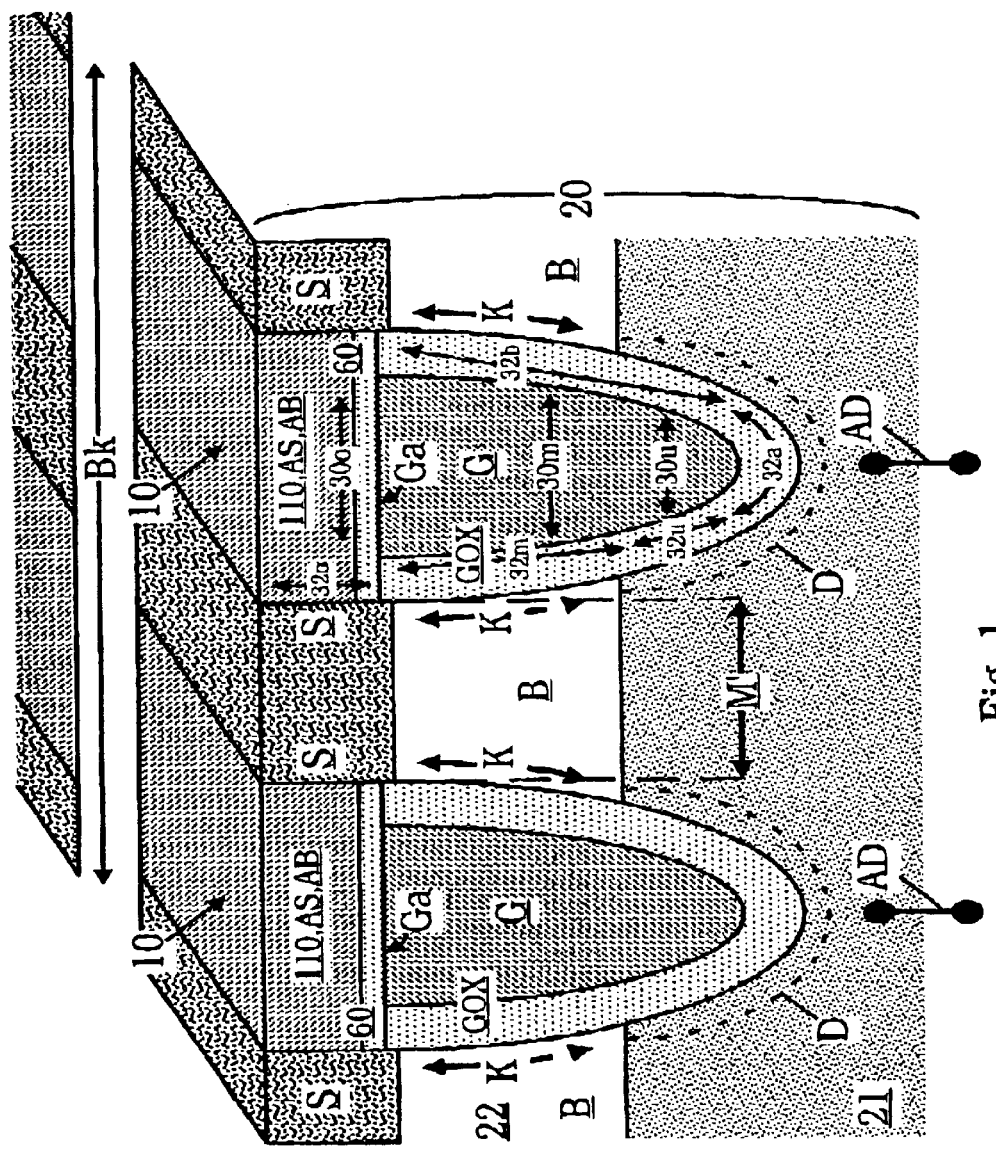
FIGS. 1–3 are diagrammatic sectional, perspective side views showing three different embodiments of the semiconductor component according to the invention.

Referring now to the figures of the drawings in detail and first, particularly to FIG. 1 thereof, there is shown a conventional semiconductor component 200.

Figure 5:
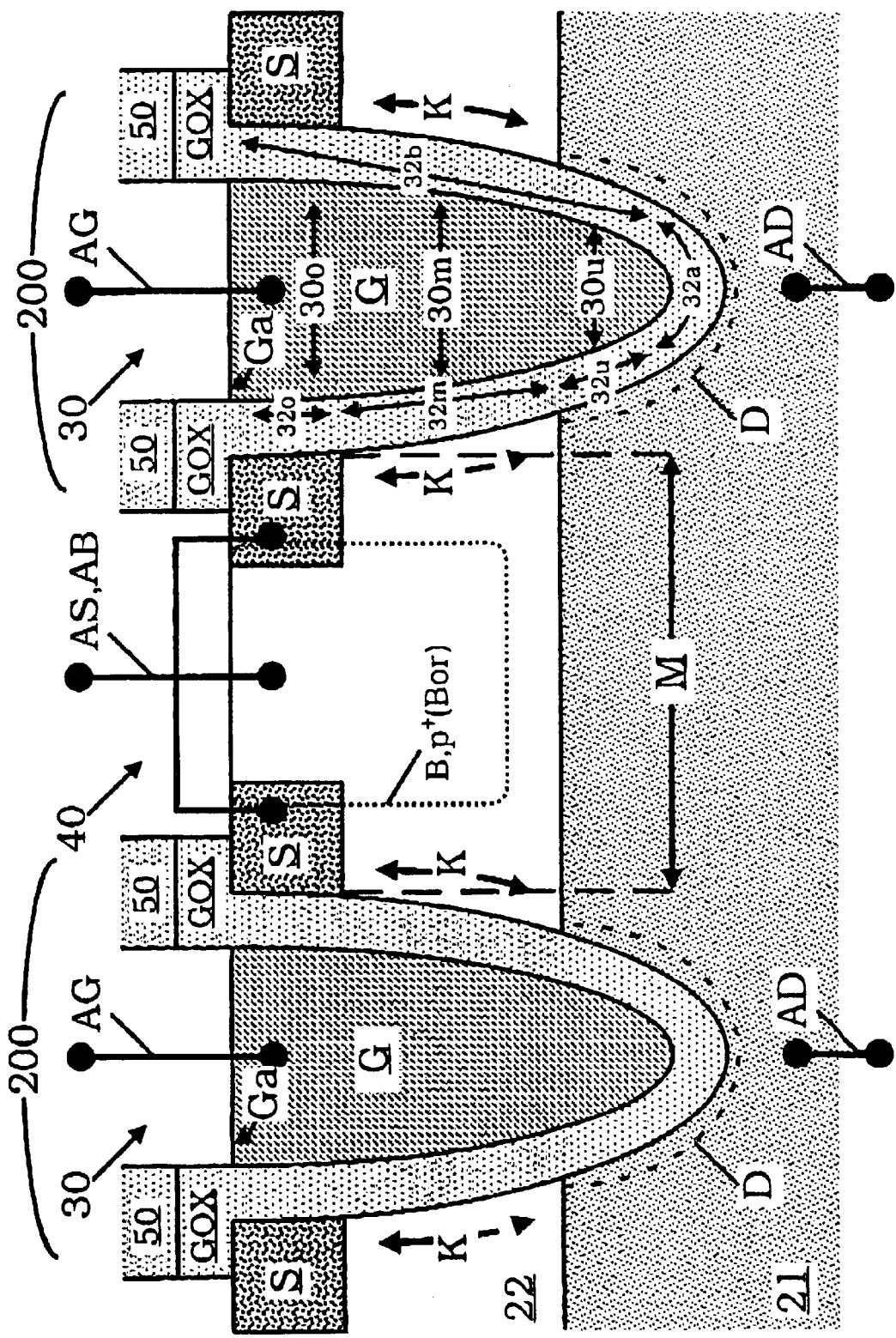
FIG. 5 is a diagrammatic sectional view of a semiconductor component.

FIG. 5 shows a detail from a conventional semiconductor circuit configuration with two conventional semiconductor components 200. The conventional semiconductor components 200 are formed as so-called trench MOSFETS 200.

The illustration shows a semiconductor substrate region 20 including two semiconductor regions 21, e.g. silicon $n^-$-doped with phosphorus, and 22, e.g. $p^-$-doped silicon. Trenches 30 are introduced into the semiconductor substrate region 20 and filled with corresponding material combinations for forming a MOSFET.

The original trenches 30 include an upper trench section 30*o*, a central trench section 30*m*, and a lower trench section 30*u*. Each trench section 30*o*, 30*m*, 30*u* has a corresponding upper, central, and lower wall section 32*o*, 32*m*, and 32*u*, respectively, of a wall region 32b of the trench 30. Furthermore, a bottom region 32a of the trench 30 is formed. All the wall regions 32o, 32m and 32u and the bottom region 32a are lined conformally with an insulation region, namely a so-called gate oxide GOX. A polysilicon n$^+$-doped, e.g., by adding phosphorus, is filled into the remaining free space as so-called plug. This filling serves as gate G of the respective conventional semiconductor component as MOSFET. The gate G, also referred to as third contact region G in the nomenclature below, is externally contact-connected via a corresponding terminal region AG or fourth terminal region AG and has a corresponding control voltage applied to it during operation.

Outside the respective trench 30 terminals for source S, body B or substrate B (see FIG. 1), and drain D are provided, which are also referred to as first, second and fourth contact regions S, B and D, respectively, in the nomenclature below.

A common metallization and e.g. the corresponding p$^+$-type doping with boron in the intermediate region M between the adjacent conventional semiconductor components 200 creates a common terminal region AS or AB for the source contact region S and the body contact region B.

On account of the process accuracy, which can be achieved at the current time and on account of the configuration of the terminal regions AS and AB for source S and body B between the semiconductor components 200, the intermediate region M between the adjacent conventional semiconductor components, which is also referred to as silicon mesa or mesa structure, assumes a minimum extent which cannot be undershot. This is also connected with the fact that a contact hole 40 to be formed, which is necessary for the processing of the terminal regions AS and AB, has a minimum size. Furthermore, the positions and extents of the trenches 30, of the gate oxide GOX and of the further insulation regions 50 are provided with fluctuations on account of the customary process implementations.

Three different exemplary embodiments for the semiconductor component according to the invention will now be discussed below. These exemplary embodiments are illustrated in diagrammatic perspective and sectional side view in FIGS. 1, 2 and 3.

First, the mesa structure M' between adjacent semiconductor components 10 according to the invention has a very much smaller lateral extent in comparison with the mesa structure M of the conventional configuration with conventional semiconductor components 200 in accordance with FIG. 5: M'<M.

This is achieved according to the invention by virtue of the fact that at least a part of the terminal regions AS and AB for the source contact regions S and body contact regions B, as first and third contact regions S and B, respectively, of the semiconductor components 10 according to the invention, are transferred to within the respective trench 30 and, if appropriate, into the region above the latter. Thus, the terminal regions are introduced into the inside of the respective trench 30 at least to a depth of, in particular 50 nm. The space liberated as a result in the region of the original mesa structure M for isolation and insulation of conventional adjacent semiconductor components 200 is no longer necessary and, consequently in the case of the procedure according to the invention, the adjacent semiconductor components 10 can move closer together, thereby enabling a higher integration density in the case of a corresponding semiconductor circuit configuration.

In the embodiment of FIG. 1, the height of the polysilicon plug G as gate contact region G, in comparison with the conventional embodiment of FIG. 5, is lowered almost to the level of the interface between source contact region S and body contact region B. Furthermore, for the purpose of electrical insulation, a further oxide layer 60 is deposited as insulation region 60 on the surface Ga of the gate contact region G. Afterward, a further, if appropriate doped, polysilicon layer 110 is formed in order to form the common terminal regions AS and AB for the source contact regions S and body contact regions B. The polysilicon layer 110 as terminal region AS for the source contact region S is in direct contact with the source contact region S, so that the latter is directly connected and contact-connected.

The contact-connection between the common terminal region AS, AB, namely the polysilicon region 110, and the body contact region B as second contact region takes place e.g. by using a corresponding p$^+$-doped body contact strip Bk which is provided in localized form perpendicular to the course of the respective trench 30 in a manner offset laterally toward the rear. Through the sequence, for example in equidistant form, of a plurality of such body contact strips Bk that are formed in a manner offset toward the rear into the plane of the drawing, the trench 30 extending along the plane of the drawing is thus subdivided into a multiplicity of successive semiconductor components 10 according to the invention or MOSFET transistors 10 according to the invention.

Figure 2:
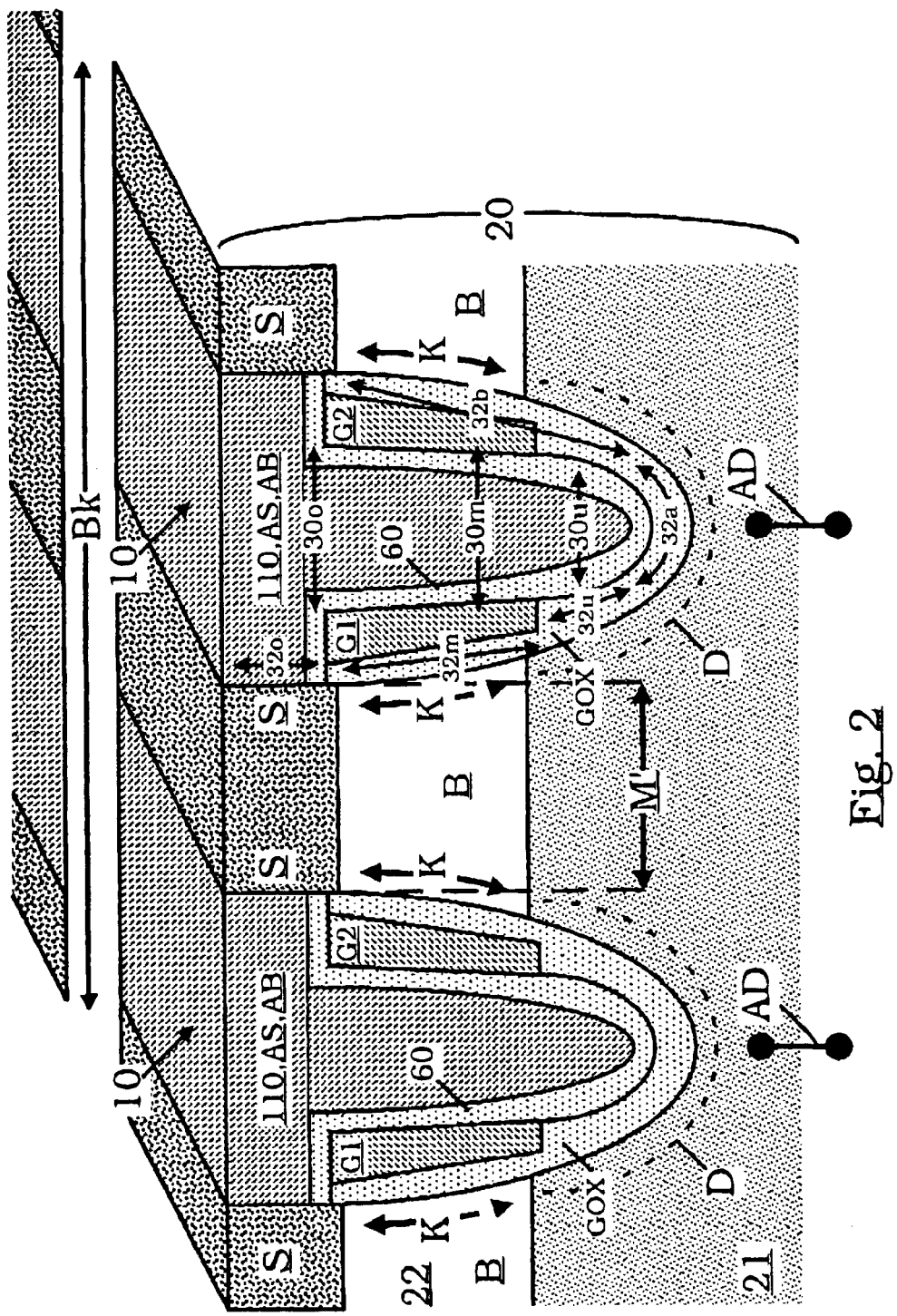

The embodiment of the semiconductor component 10 according to the invention as illustrated in FIG. 2 differs from the embodiment of FIG. 1 to the effect that the polysilicon plug that is n$^+$-doped here with phosphorus and serves for forming the gate contact region G is formed in a manner subdivided into two spatial separate material regions or gate regions G1 and G2, and that here a transistor of the field plate type is formed, gate oxide GOX and field oxide FOX, 60 being provided within the trench. The thus in total greater oxide layer thickness including FOX and GOX in the lower trench section 30u between the poly plug of the gate terminal G and the body region B and drain region D brings about the formation of, a space charge zone in the region of the lower trench section 30u during operation. Higher breakdown voltages can thus be achieved for the component, which is essential in the area of high-voltage and/or power semiconductors.

In this embodiment, the polysilicon plug 100, 110 for forming the common terminal region AS, AB for source and body reaches down to the gate oxide region GOX in the vicinity of the bottom region 32a of the trench 30. The gate G formed by the two material regions G1 and G2 is again electrically insulated from the common terminal region AS, AB for source and body by a second insulation layer 60. The contact-connection of the body contact region B is again effected by so-called body contact strips Bk, to be precise in a manner analogous to that explained in detail in connection with FIG. 1.

Figure 3:
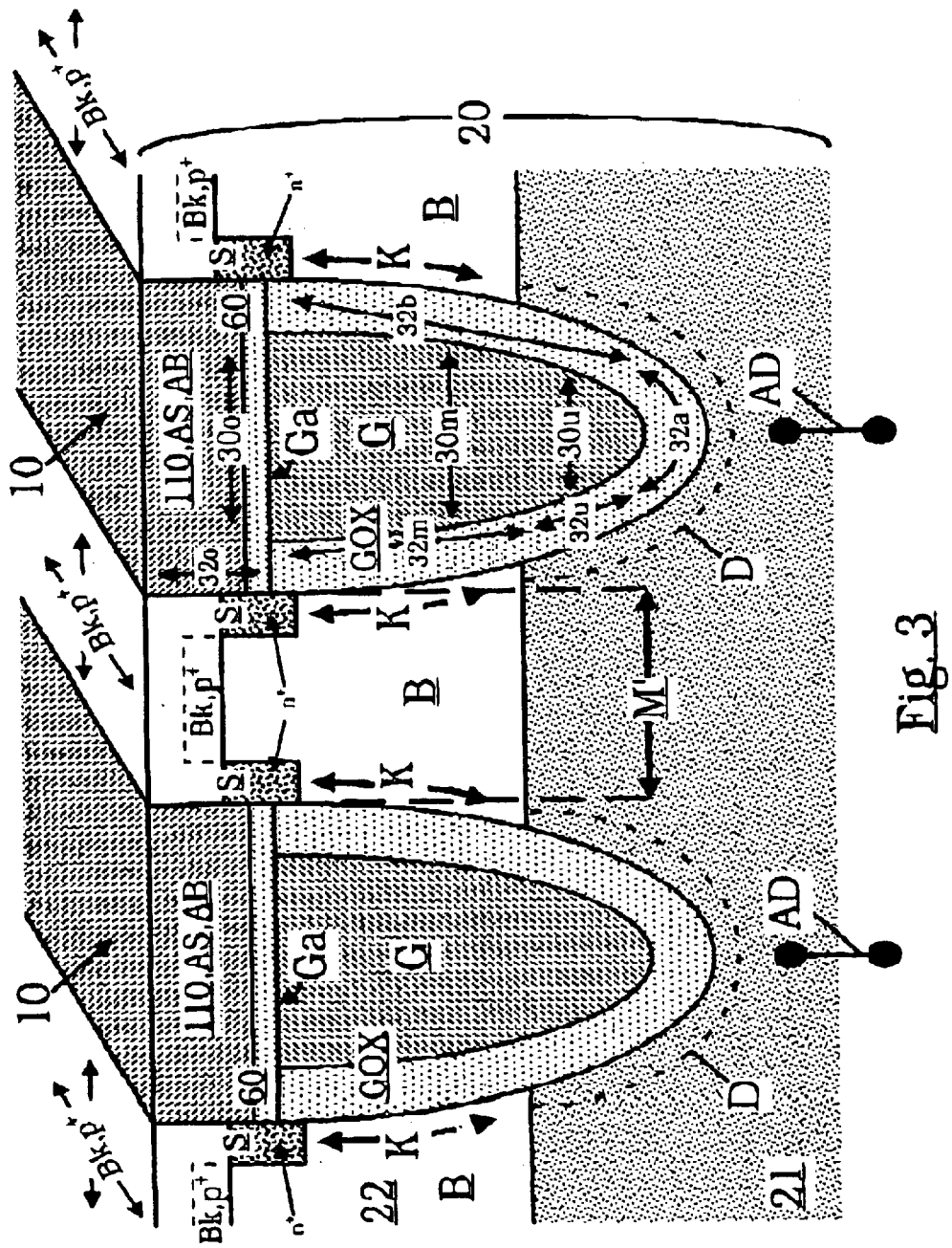

The embodiment of FIG. 3 corresponds to the embodiment of FIG. 1 with regard to the contact region G within the trench 30, namely with regard to the gate G. The embodiment of FIG. 3 differs, however, with regard to the contact-connection of the body region B and of the source region S.

Via the common terminal region AS, AB in the upper trench section 30o of the trench 30, a direct contact is made in the upper trench sidewall 32o of the trench wall region 32b to the source contact region S. In this case, the source contact region S is formed—in cross section—as an n$^+$-doped conductivity region for instance in the form of an inverted U between the adjacent semiconductor components 10 according to the invention. This U may also be interrupted in the center, so that two approximately mirror-symmetrical arcs are situated opposite one another.

For the contact-connection of the body contact regions B, the surface region of the mesa structure between the adjacent components 10 is formed in planar fashion and such that it is p$^+$-doped overall. This p$^+$-doped conductivity region Bk' brings about electrical contact-connection between the body contact region B and the common terminal region AS, AB within the trench 30.

The sequence of FIGS. 4A to 4M then shows a process sequence for forming the embodiment of the semiconductor component according to the invention as shown in FIG. 2. A perspective illustration is not used in this case. FIG. 4M shows two components 10 isolated by a mesa M1 formed in between, which, for its part, is smaller than the trench width.

FIG. 4A illustrates the layer structure of the starting semiconductor substrate 20 with a first semiconductor layer 21, for example in the form of an n$^-$-phosphorus-doped epitaxial silicon region, and a second silicon layer 22.

Figure 4B:
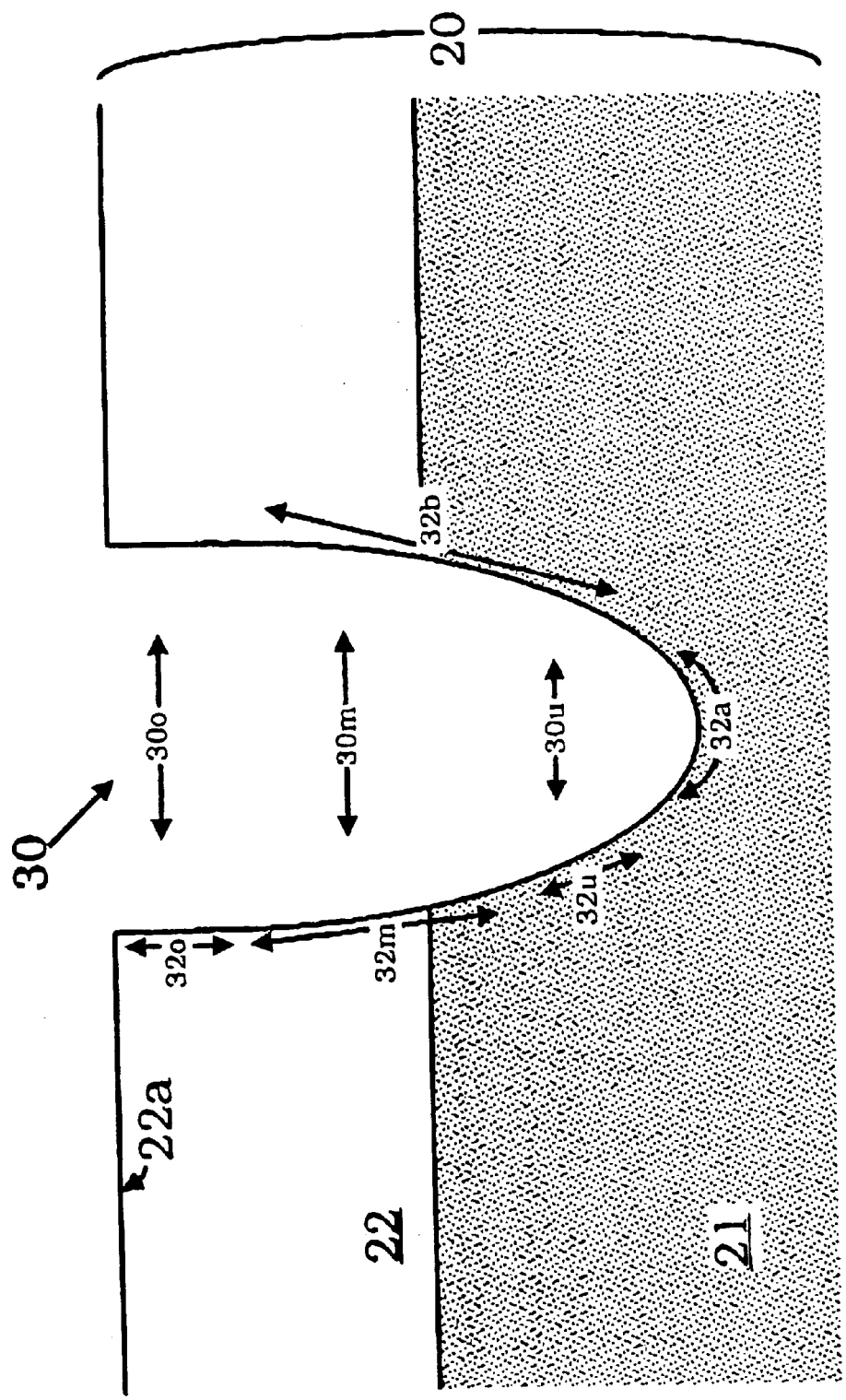

In the transition to the intermediate state of FIG. 4B, a trench 30 is introduced into the semiconductor substrate region 20, which trench has an upper, a central, and a lower trench section 30$o$, 30$m$ and 30$u$, respectively. The trench 30 furthermore has wall regions 32$b$ and a bottom region 32$a$. The wall region 32$b$ is subdivided into an upper, central and lower wall section 32$o$, 32$m$, and 32$u$, respectively.

Figure 4C:
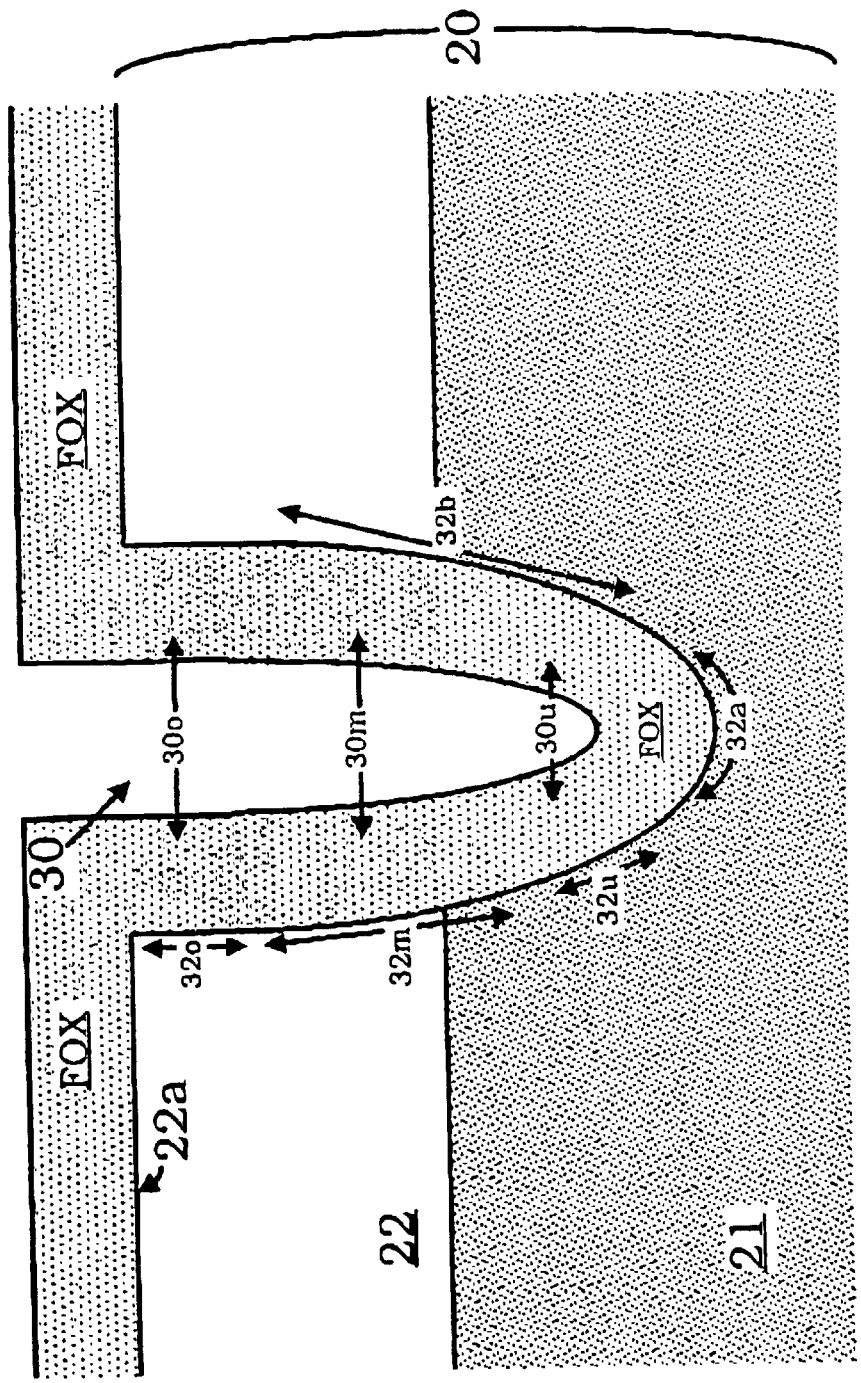

In the transition to the intermediate state of FIG. 4C, a so-called field oxide FOX is formed in the form of a conformal silicon dioxide layer.

Figure 4D:
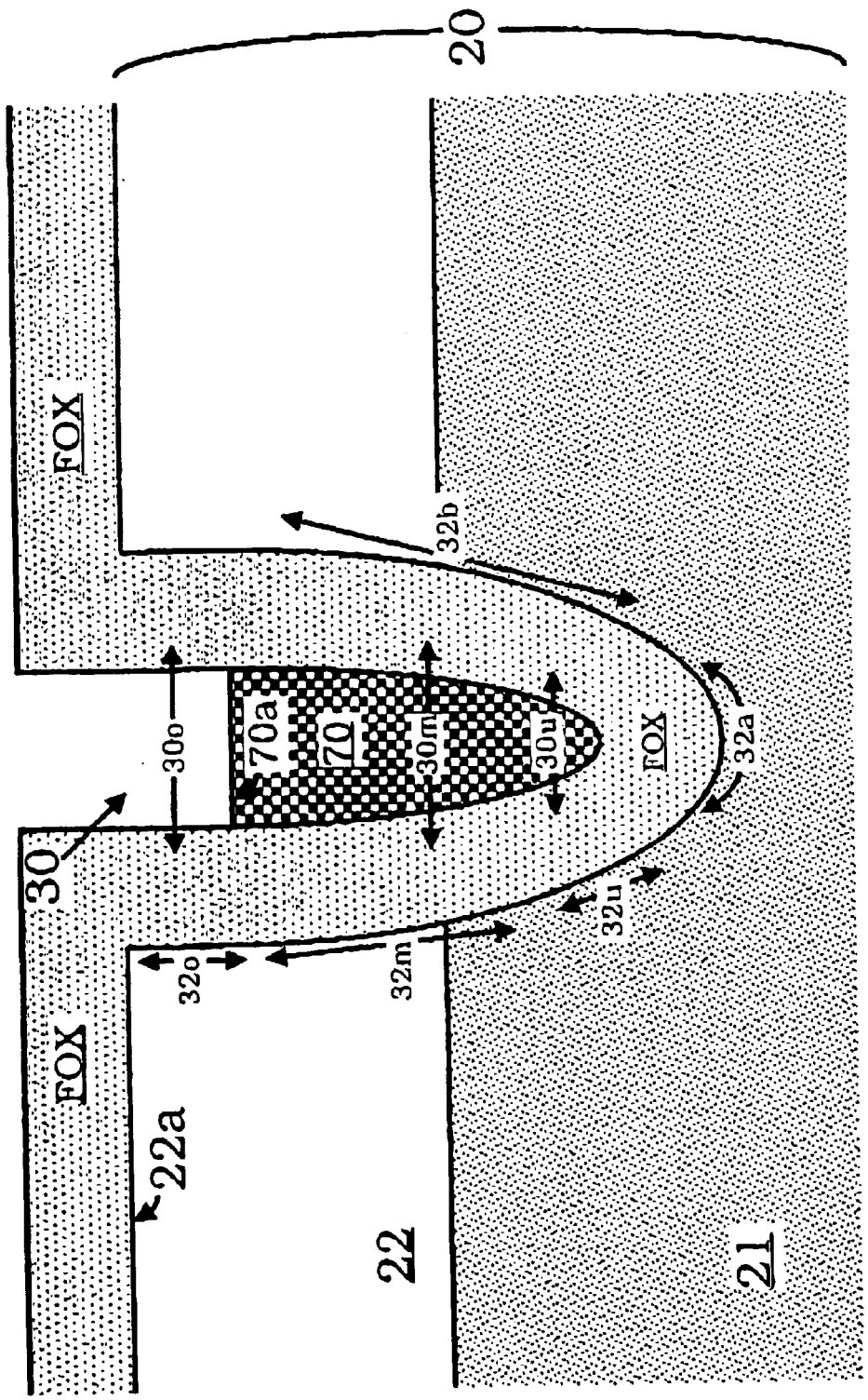

In the transition to the state of FIG. 4D, the respective trench 30 is then filled with a plug made of silicon nitride material 70 by deposition of silicon nitride and etching-back down to a level 70$a$, which is formed below the surface 22$a$ of the semiconductor substrate region 22. The silicon nitride plug 70 serves as a type of spacer for the further process implementation.

Figure 4E:
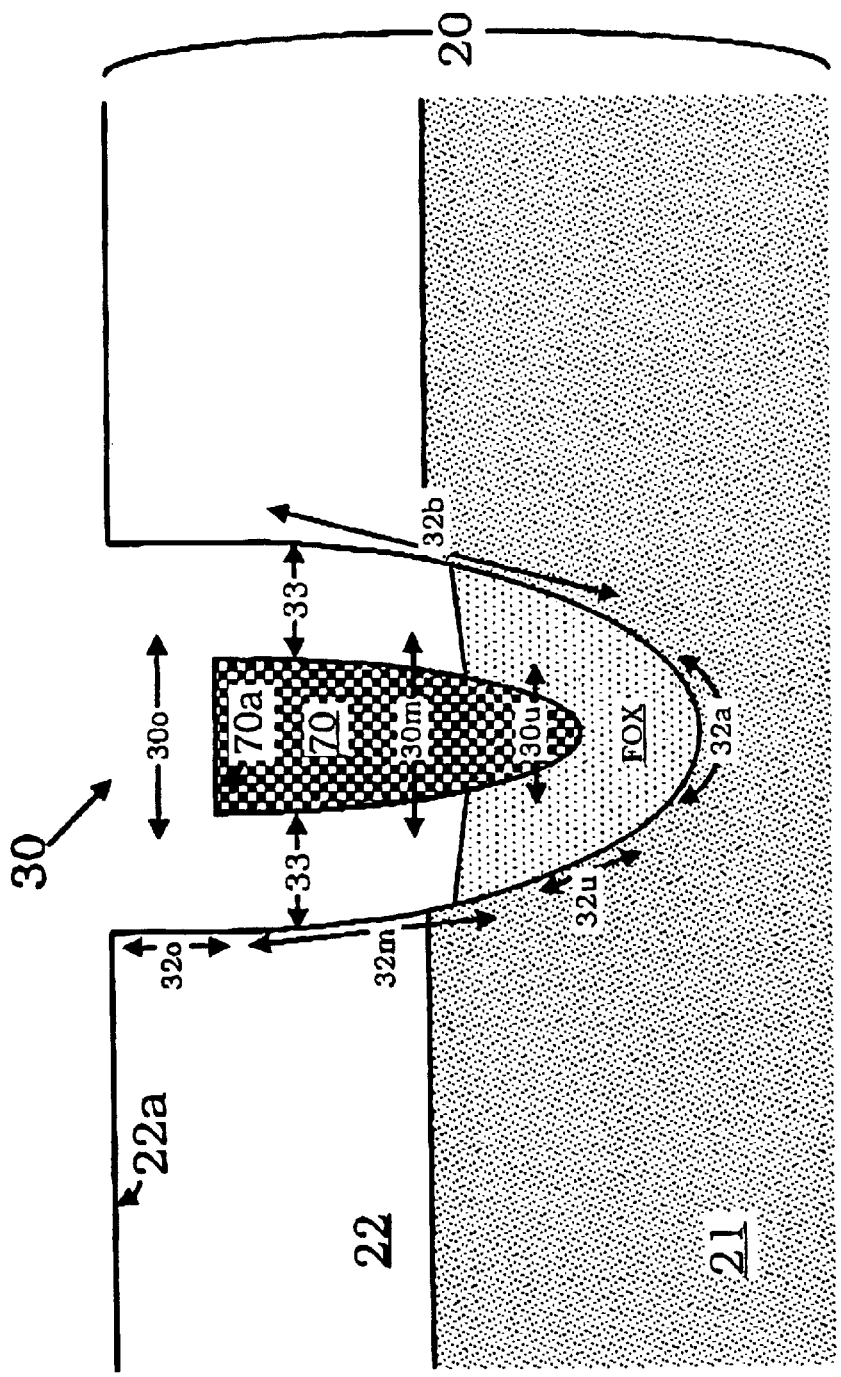

In the transition to the intermediate state shown in FIG. 4E, the field oxide FOX is then etched back, so that an interspace 33 is formed between the plug region 70 and the wall region 32$b$ of the trench 30.

Figure 4F:
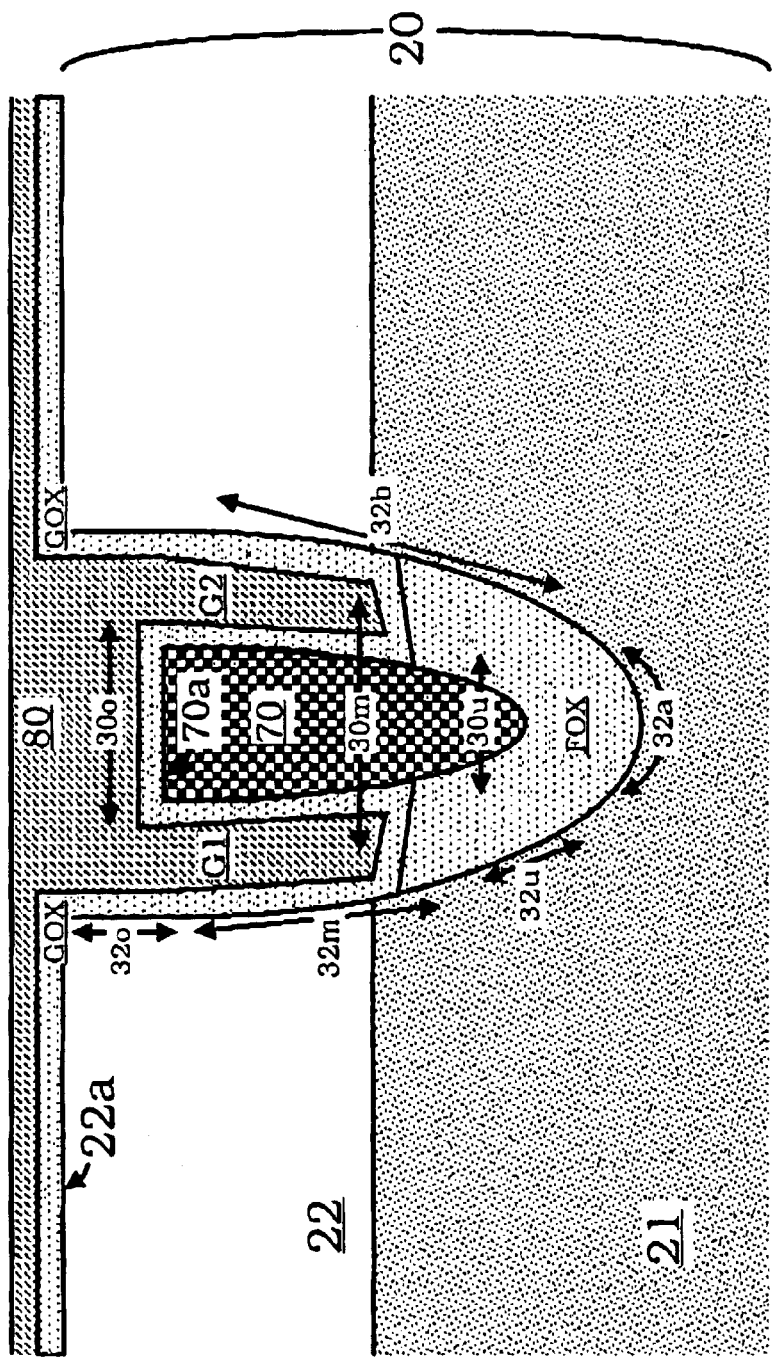

In the transition to the intermediate state shown in FIG. 4F, a silicon oxide is then deposited conformally, thereby forming the so-called gate oxide GOX. Afterward, filling with polysilicon 80 is effected and then, in the transition to the intermediate state shown in FIG. 4G, etching-back is effected, as a result of which the later regions G1 and G2 of the gate G are then produced.

Figure 4H:
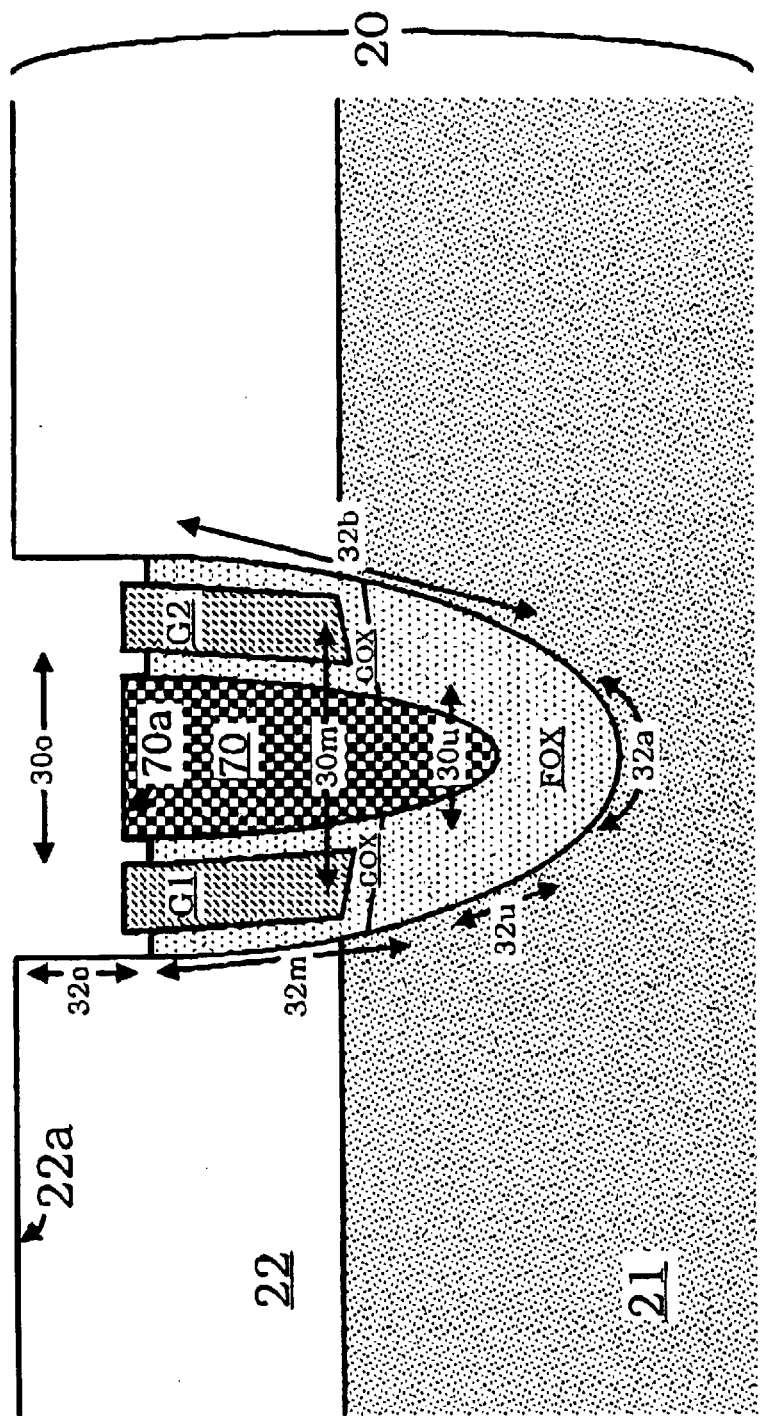

In the transition to the intermediate state of FIG. 4H, the gate oxide GOX is then etched back in such a way that the central plug 70 is uncovered at its surface 70$a$.

Figure 4I:
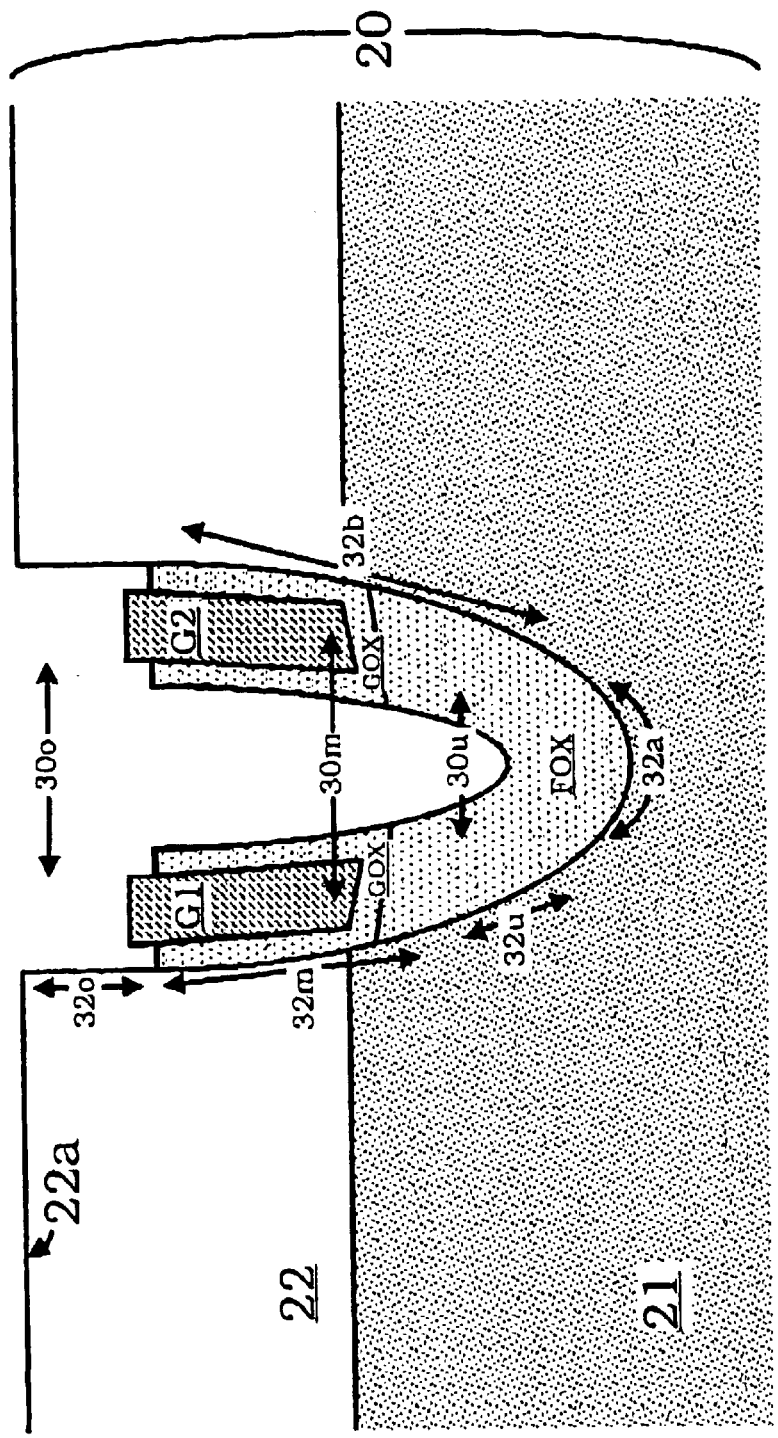

In the transition to the intermediate state of FIG. 4I the freed plug region 70 is then etched out selectively with respect to the silicon and with respect to the silicon dioxide of the surroundings; this is possible because the plug region 70 is composed for example of silicon nitride or the like.

Figure 4J:
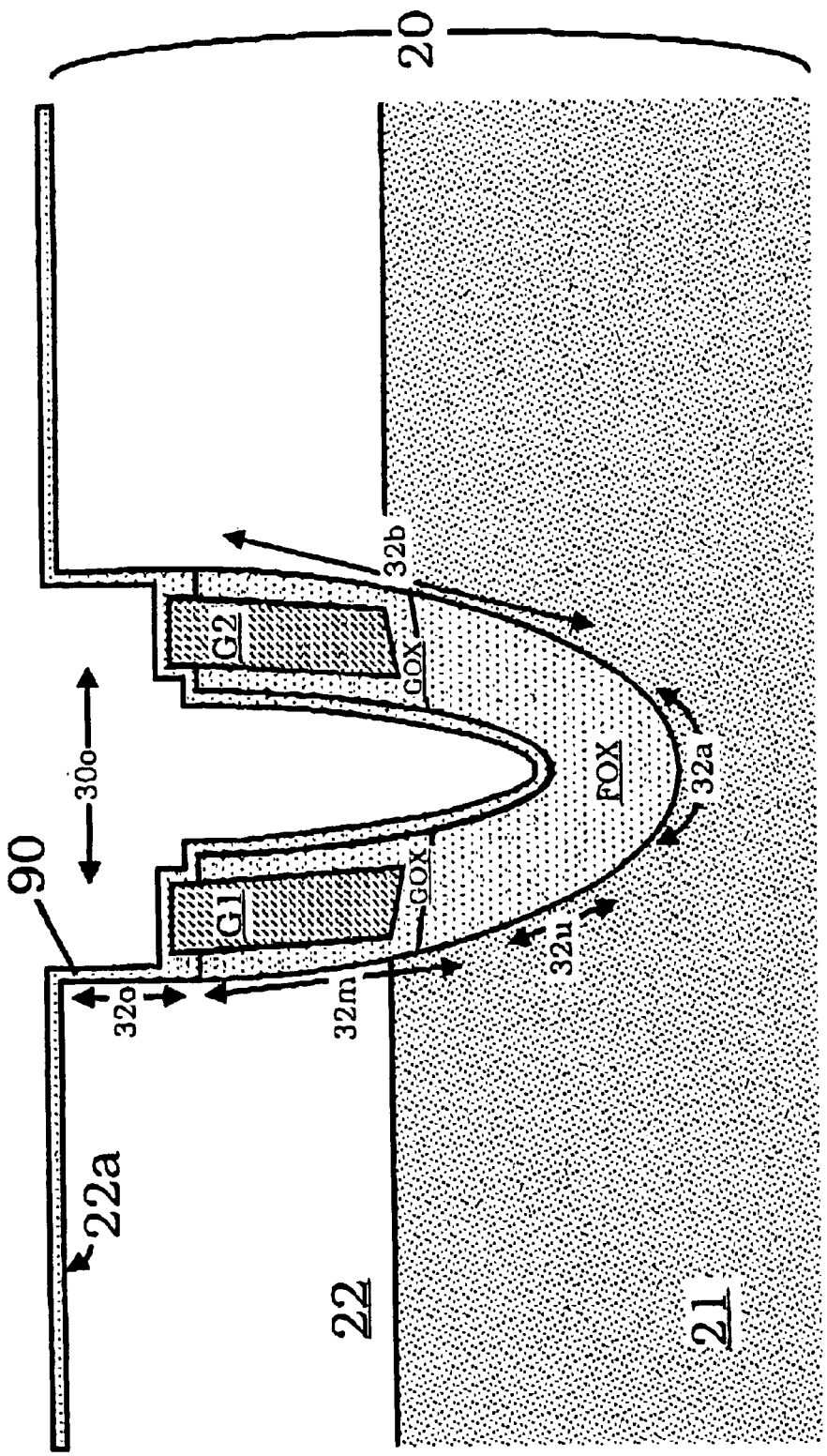

For the insulation of the gate regions G1 and G2, which are later to form the third contact region or gate contact region G, in accordance with FIG. 4J, a so-called isolation oxide 90 is then deposited essentially conformally, or applied by oxidation. The isolation oxide 90 also runs on the trench inner walls and thus covers the gate oxide GOX and the field oxide FOX.

Figure 4K:
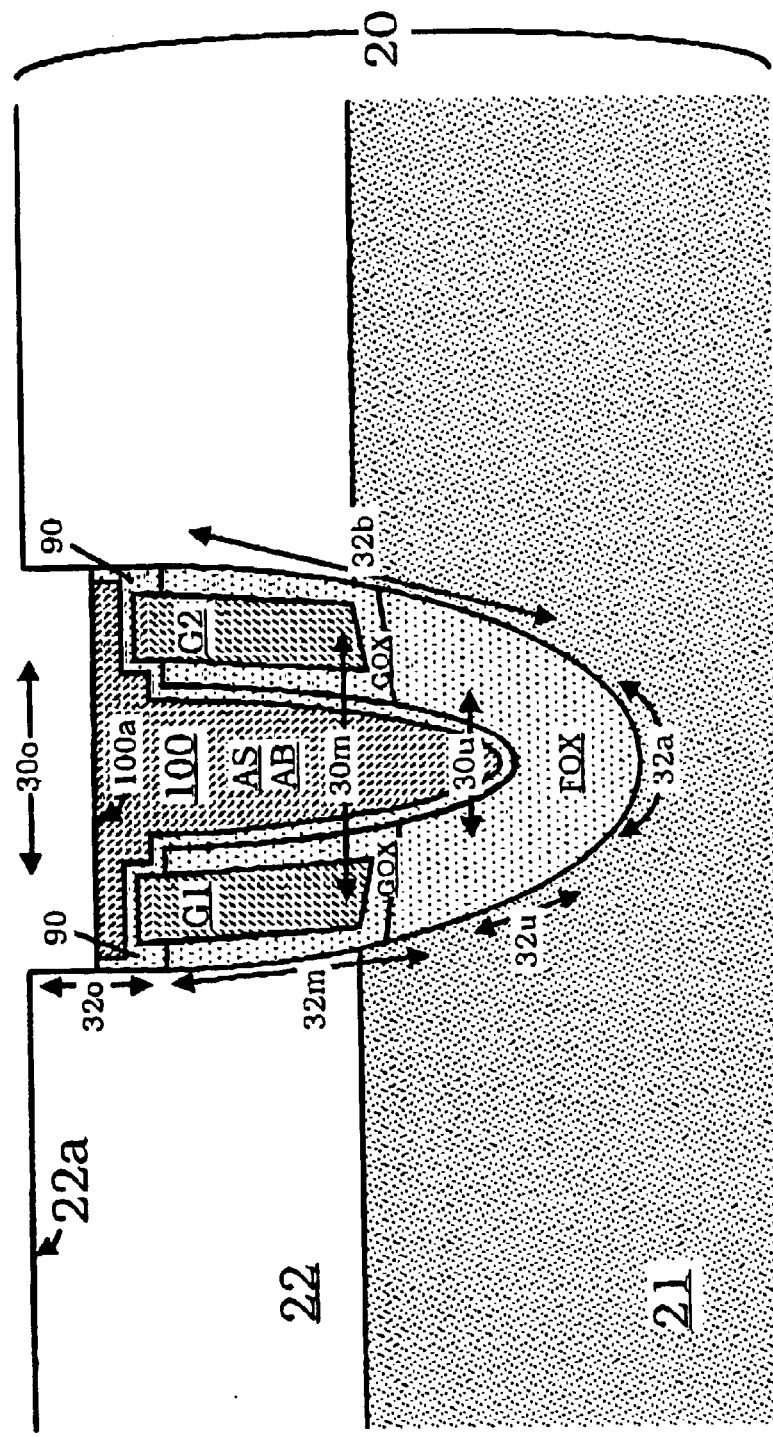

A polysilicon layer 100 is then subsequently deposited, namely in order to fill the recess formerly occupied by the silicon nitride plug 70. Corresponding etching-back takes place to a level lying just above the polysilicon regions or gate regions G1 or G2. In this case, the isolation oxide 90 is removed on the silicon surface 22$a$ and on the trench sidewall, which are uncovered, the polysilicon 100 for the first contact region or source contact region S that is later to be formed serving as a first constituent of the so-called polysilicon plug. The result is illustrated in FIG. 4K.

Figure 4L:
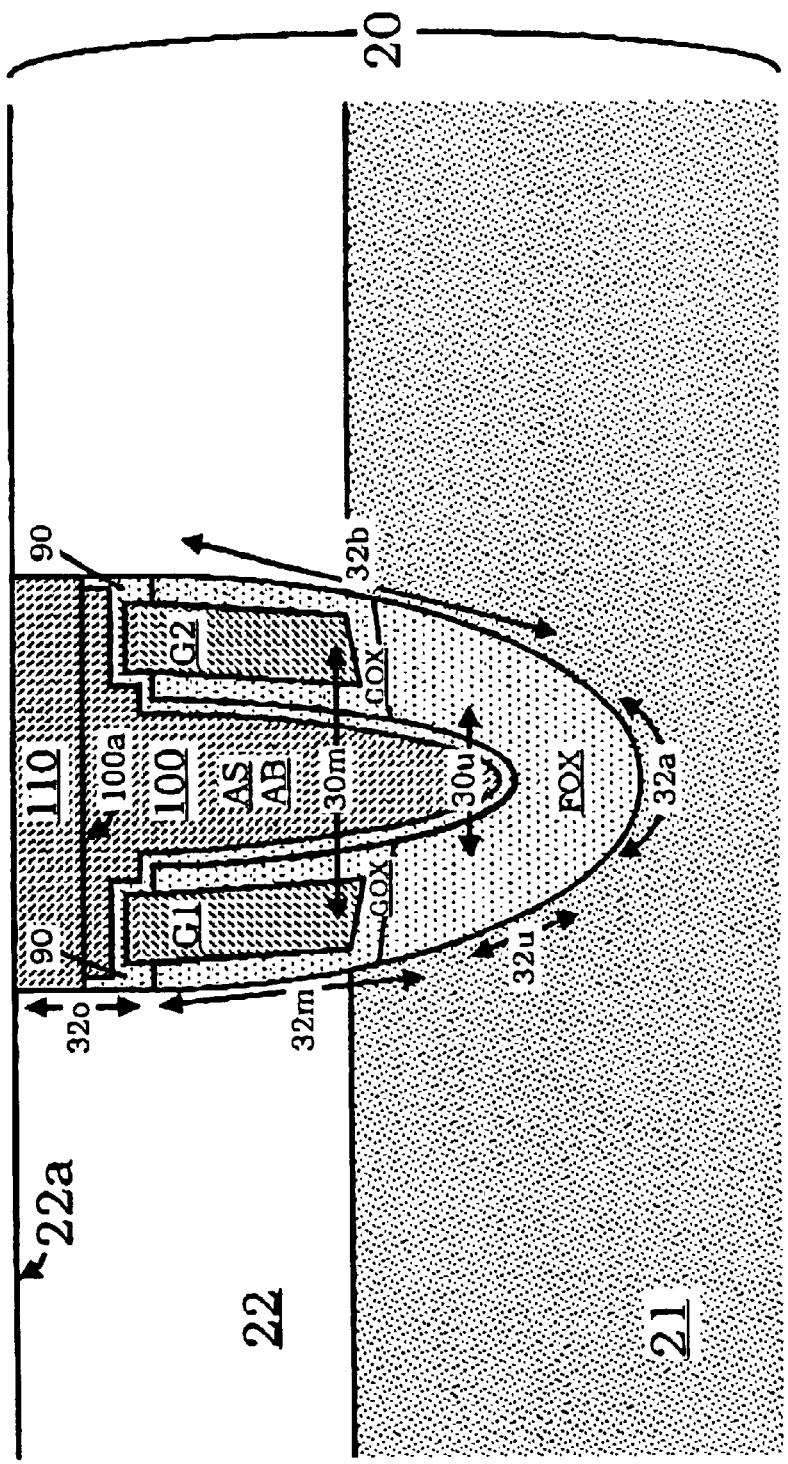
Figure 4M:
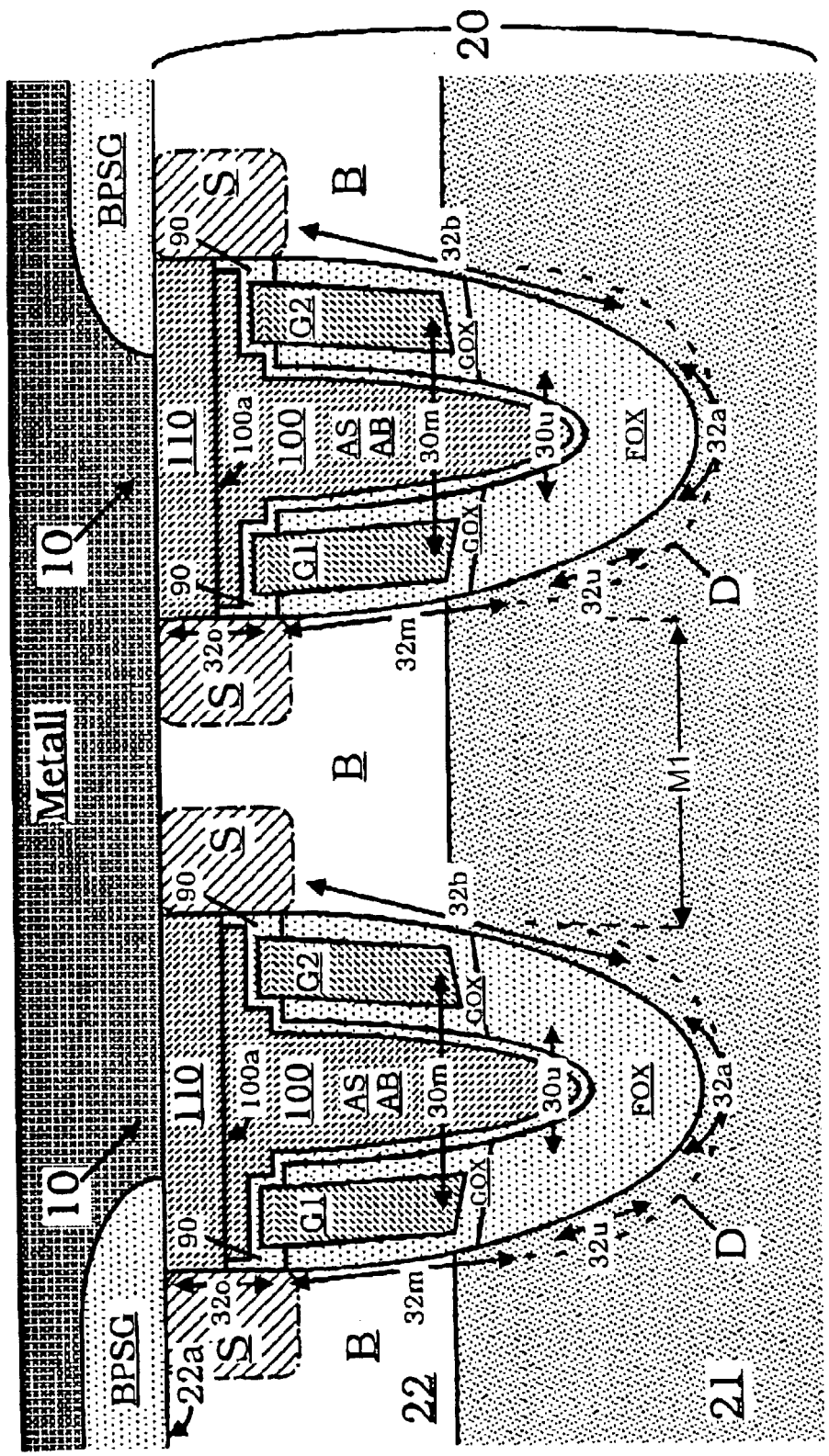

In the transition to the intermediate state of FIG. 4L, polysilicon 110 is then deposited again, the trench 30 being filled, to be precise up to the level of the surface region 22$a$ of the second semiconductor substrate region 22. The polysilicon plug is thereby completed in the interaction of the polysilicon regions 100, 110. As an alternative or in addition, it is also possible to effect a siliconizing step with subsequent polysilicon deposition for the source contact region S. Optionally, etching-back of the source polysilicon is also conceivable, a siliconizing stop then being effected.

The optional BPSG deposition with subsequent large-area patterning and etching-back down to the silicon surface or polysilicon surface is then effected, the so-called contact holes being formed into which are then formed corresponding metallizations for ultimately realizing the source/body contacts in the sense of a source/body metallization. This state is illustrated in FIG. 4M.

What is claimed is:

1. A semiconductor component, comprising:
   a semiconductor substrate region having a trench with a width, wall regions, and a bottom region formed therein, said wall regions including an upper trench section;
   a contact region formed outside and directly proximate said trench in a region of said upper trench section;
   a terminal region for electrical connection of said contact region and formed at least partly within said trench; and
   a trench side region being narrower than said width of said trench;
   said semiconductor substrate region having a further trench formed therein;
   said trench side region being a mesa region between said two trenches.

2. The semiconductor component according to claim 1, wherein said wall region has an upper wall section; and
   a contact between said contact region and said terminal region is disposed in a part of said upper wall section of said wall region of said trench.

3. The semiconductor component according to claim 2, wherein said contact is selected from the group consisting of a direct mechanical and electrical contact, a contact via a diffusion region, and a contact via an implantation region.

4. The semiconductor component according to claim 2, wherein:
   said wall region of said trench has an upper wall section; and said first contact region forms at least a part of said upper wall section of said wall region of said trench.

5. A semiconductor component, comprising:
   a semiconductor substrate region having a trench with a width, wall regions, and a bottom region formed therein, said wall regions including an upper trench section;
   a contact region formed outside and directly proximate said trench in a region of said upper trench section;
   a terminal region for electrical connection of said contact region and formed at least partly within said trench;
   a trench side region being narrower than said width of said trench;

said trench having a central trench section;
a further contact region being formed outside said trench directly proximate said trench in a region of said central trench section; said semiconductor substrate region having a further trench formed therein;
said trench side region being a mesa region between said two trenches.

6. The semiconductor component according to claim 5, further comprising a further terminal region for electrical connection of said further contact region formed at least partly within said trench.

7. The semiconductor component according to claim 6, wherein said terminal regions for said first and second contact regions are formed at least partly as a common terminal region.

8. The semiconductor component according to claim 7, wherein said terminal regions are formed within said trench.

9. The semiconductor component according to claim 7, wherein said common terminal region of said terminal regions is formed at least in a region of said upper trench section.

10. The semiconductor component according to claim 9, wherein:
said wall region of said trench has an upper wall section; and said first contact region forms at least a part of said upper wall section of said wall region of said trench.

11. The semiconductor component according to claim 7, wherein said wall region has an upper wall section; and
a contact between said first contact region and said common terminal region is disposed in a part of said upper wall section of said wall region of said trench.

12. The semiconductor component according to claim 11, wherein said contact is selected from the group consisting of a direct mechanical and electrical contact, a contact via a diffusion region, and a contact via an implantation region.

13. The semiconductor component according to claim 11, wherein:
said wall region of said trench has an upper wall section; and said first contact region forms at least a part of said upper wall section of said wall region of said trench.

14. The semiconductor component according to claim 7, further comprising a contact of said further contact region contacting said common terminal region, said contact being formed via one of a diffusion region and an implantation region.

15. The semiconductor component as claimed in claim 14, wherein said one of a diffusion region and an implantation region for said contact connected to said second contact region is formed as a localized surface strip running transversely with respect to said trench.

16. The semiconductor component according to claim 14, wherein said one of a diffusion region and an implantation region for said contact connected to said further contact region is formed as a surface region running longitudinally with respect to said trench.

17. The semiconductor component according to claim 16, wherein said surface region overlaps said contact region.

18. The semiconductor component according to claim 7, wherein:
a second-further contact region is formed at least partly within said trench in said region of said central trench section; and
at least one of an insulation region and an isolation oxide electrically insulates said second-further contact region from said contact region and said further contact region and from said common terminal region.

19. The semiconductor component according to claim 7, further comprising:
a second-further contact region is formed within said trench; and
a third-further contact region formed outside said trench directly proximate said trench in said region of said lower trench section;
said common terminal region is formed as a source-body terminal region;
said second-further contact region is a gate region; and
said third-further contact region is a drain region.

20. The semiconductor component according to claim 6, further comprising a second semiconductor substrate within said trench and having a surface region, at least one of said terminal regions being formed with a depth of at least 50 nm from said surface region of said second semiconductor substrate.

21. The semiconductor component according to claim 6, wherein said terminal regions for said contact regions are formed at least in a region of said upper trench section.

22. The semiconductor component according to claim 21, wherein:
said wall region of said trench has an upper wall section; and
said first contact region forms at least a part of said upper wall section of said wall region of said trench.

23. The semiconductor component according to claim 6, further comprising a contact of said further contact region contacting said further terminal region, said contact being formed via one of a diffusion region and an implantation region.

24. The semiconductor component as claimed in claim 23, wherein said one of a diffusion region and an implantation region for said contact connected to said second contact region is formed as a localized surface strip running transversely with respect to said trench.

25. The semiconductor component according to claim 23, wherein said one of a diffusion region and an implantation region for said contact connected to said further contact region is formed as a surface region running longitudinally with respect to said trench.

26. The semiconductor component according to claim 25, wherein said surface region overlaps said contact region.

27. The semiconductor component according to claim 6, wherein:
a second-further contact region is formed at least partly within said trench in said region of said central trench section; and
at least one of an insulation region and an isolation oxide electrically insulates said second-further contact region from said contact region and said further contact region and from said terminal region and further terminal region.

28. The semiconductor component according to claim 5, wherein at least one of said contact region and said further contact region contact said wall region of said respective trench sections respectively.

29. The semiconductor component according to claim 5, wherein said further contact region is formed directly proximate said first contact region.

30. The semiconductor component according to claim 5, wherein said further contact region directly contacts said first contact region.

31. The semiconductor component according to claim 5, wherein:
said wall section of said trench has a central wall section; and said further contact region forms at least a part of said central wall section of said wall region of said trench.

32. The semiconductor component according to claim 5, further comprising a second-further contact region formed within said trench.

33. The semiconductor component according to claim 32, wherein:
   said trench has a lower trench section below said central trench section;
   said lower trench section defines a region; and
   a third-further contact region formed outside said trench directly proximate said trench in said region of said lower trench section.

34. The semiconductor component according to claim 33, wherein:
   said contact region is a source region;
   said further contact region is one of a body region and a substrate region;
   said second-further contact region is a gate region; and
   said third-further contact region is a drain region.

35. The semiconductor component according to claim 32, wherein said second-further contact region is formed within said trench.

36. The semiconductor component according to claim 35, wherein said second-further contact region is formed as a polysilicon region.

37. The semiconductor component according to claim 32, wherein a common terminal region for said contact region and second-further contact region is formed within the trench.

38. The semiconductor component according to claim 37, wherein said common terminal region is formed as a polysilicon region.

39. The semiconductor component according to claim 32, wherein at least one of said contact region and said second-further contact region are formed as conductivity regions having an inverted-U-shaped cross section.

40. The semiconductor component according to claim 39, wherein said contact region and said second-further contact region are disposed between adjacent semiconductor components.

41. The semiconductor component according to claim 39, wherein said inverted-U-shaped cross section has a U arc, said U-arc having an interruption.

42. The semiconductor component according to claim 41, wherein said inverted-U-shaped cross section has a mesa defined at a region proximate an adjacent semiconductor component, and said interruption is located in said mesa.

43. The semiconductor component according to claim 32, further comprising:
   a terminal metallization; and
   an insulation layer isolating said second-further contact region formed within said trench from said terminal metallization;
   said terminal regions for said contact region and second-further contact region further isolating said second-further contact region from said terminal metallization.

44. The semiconductor component according to claim 43, wherein said insulating layer is an isolation oxide.

45. The semiconductor component according to claim 43, wherein said contact region and said second-further contact region are formed as a polysilicon region.

46. The semiconductor component according to claim 32, further comprising:
   a terminal region and an electrode region disposed with said contact regions within said trench;
   said terminal region, said electrode region, and said contact regions being formed from a material selected from the group consisting of polysilicon, metal, and silicide.

47. The semiconductor component according to claim 46, wherein said contact regions, said terminal region, and said electrode region have terminal regions for said contact region and said second-further contact region.

48. The semiconductor component according to claim 47, further comprising a terminal region for said second-further contact regions.

49. The semiconductor component according to claim 5, wherein a second-further contact region is formed at least partly within said trench in said region of said central trench section.

50. A trench structure transistor, comprising:
   a semiconductor substrate region having a trench with a width, wall regions, and a bottom region formed therein, said wall regions including an upper trench section;
   a contact region formed outside and directly proximate said trench in a region of said upper trench section;
   a terminal region for direct electrical connection of said contact region and formed at least partly within said trench; and
   a trench side region being narrower than said width of said trench;
   said semiconductor substrate region having a further trench formed therein;
   said trench side region being a mesa region between said two trenches.

51. A trench MOSFET, comprising:
   a semiconductor substrate region having a trench with a width, wall regions, and a bottom region formed therein, said wall regions including an upper trench section;
   a contact region formed outside and directly proximate said trench in a region of said upper trench section;
   a terminal region for direct electrical connection of said contact region and formed at least partly within said trench; and
   a trench side region being narrower than said width of said trench;
   said semiconductor substrate region having a further trench formed therein;
   said trench side region being a mesa region between said two trenches.

52. An IGBT, comprising:
   a semiconductor substrate region having a trench with a width, wall regions, and a bottom region formed therein, said wall regions including an upper trench section;
   a contact region formed outside and directly proximate said trench in a region of said upper trench section;
   a terminal region for direct electrical connection of said contact region and formed at least partly within said trench; and
   a trench side region being narrower than said width of said trench;
   said semiconductor substrate region having a further trench formed therein;
   said trench side region being a mesa region between said two trenches.

53. A field plate transistor, comprising:
  a semiconductor substrate region having a trench with a width, wall regions, and a bottom region formed therein, said wall regions including an upper trench section;
  a contact region formed outside and directly proximate said trench in a region of said upper trench section;
  a terminal region for direct electrical connection of said contact region and formed at least partly within said trench;
  a trench side region being narrower than said width of said trench;
  a second-further contact region is formed within said trench; and
  a third-further contact region formed outside said trench directly proximate said trench in said region of said lower trench section.

54. The field plate transistor according to claim 53, further comprising:
  a reinforced insulation region formed within at least one of said lower trench section, a transition region between said lower trench section and said central trench section between said semiconductor substrate region and said third contact region, said terminal regions for the first and third contact region, in particular the source and body contact regions.

55. The field plate transistor according to claim 54, wherein reinforced insulation region is a field plate.

56. The field plate transistor according to claim 53, wherein reinforced insulation region is a gate oxide formed within said trench.

57. The field plate transistor according to claim 54, wherein reinforced insulation region is a field oxide formed within said trench.

58. The semiconductor component according to claim 53, wherein:
  said semiconductor substrate region has a further trench formed therein;
  said trench side region is a mesa region between said two trenches.

59. A semiconductor component, comprising:
  a semiconductor substrate region having a trench with a width, wall regions, a bottom region, and a central trench section, formed therein, said wall regions including an upper trench section; and
  a contact region formed outside and directly proximate said trench in a region of said upper trench section;
  a terminal region for electrical connection of said contact region and formed at least partly within said trench; and
  a trench side region being narrower than said width of said trench;
  a further contact region formed outside said trench directly proximate said trench in a region of said central trench section; and
  a further terminal region for electrical connection of said further contact region formed at least partly within said trench.

60. A trench structure transistor, comprising:
  a semiconductor substrate region having a trench with a width, wall regions, a bottom region, and a central trench section, formed therein, said wall regions including an upper trench section; and
  a contact region formed outside and directly proximate said trench in a region of said upper trench section;
  a terminal region for electrical connection of said contact region and formed at least partly within said trench; and
  a trench side region being narrower than said width of said trench;
  a further contact region formed outside said trench directly proximate said trench in a region of said central trench section; and
  a further terminal region for electrical connection of said further contact region formed at least partly within said trench.

61. A trench MOSFET, comprising:
  a semiconductor substrate region having a trench with a width, wall regions, a bottom region, and a central trench section, formed therein, said wall regions including an upper trench section; and
  a contact region formed outside and directly proximate said trench in a region of said upper trench section;
  a terminal region for electrical connection of said contact region and formed at least partly within said trench; and
  a trench side region being narrower than said width of said trench;
  a further contact region formed outside said trench directly proximate said trench in a region of said central trench section; and
  a further terminal region for electrical connection of said further contact region formed at least partly within said trench.

62. An IGBT, comprising:
  a semiconductor substrate region having a trench with a width, wall regions, a bottom region, and a central trench section, formed therein, said wall regions including an upper trench section; and
  a contact region formed outside and directly proximate said trench in a region of said upper trench section;
  a terminal region for electrical connection of said contact region and formed at least partly within said trench; and
  a trench side region being narrower than said width of said trench;
  a further contact region formed outside said trench directly proximate said trench in a region of said central trench section; and
  a further terminal region for electrical connection of said further contact region formed at least partly within said trench.

63. A field plate transistor, comprising:
  a semiconductor substrate region having a trench with a width, wall regions, a bottom region, and a central trench section, formed therein, said wall regions including an upper trench section; and
  a contact region formed outside and directly proximate said trench in a region of said upper trench section;
  a terminal region for electrical connection of said contact region and formed at least partly within said trench; and
  a trench side region being narrower than said width of said trench;
  a further contact region formed outside said trench directly proximate said trench in a region of said central trench section; and
  a further terminal region for electrical connection of said further contact region formed at least partly within said trench.

* * * * *